(12) United States Patent
Wu et al.

(10) Patent No.: US 9,245,961 B1
(45) Date of Patent: Jan. 26, 2016

(54) REDUCING SOURCE CONTACT TO GATE SPACING TO DECREASE TRANSISTOR PITCH

(71) Applicant: Marvell International Ltd., Hamilton (BM)

(72) Inventors: Albert Wu, Palo Alto, CA (US); Pantas Sutardja, Los Gatos, CA (US); Winston Lee, Palo Alto, CA (US); Peter Lee, Pleasanton, CA (US); Chien-Chuan Wei, San Diego, CA (US); Runzi Chang, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 14/678,616

(22) Filed: Apr. 3, 2015

Related U.S. Application Data

(62) Division of application No. 12/052,573, filed on Mar. 20, 2008, now Pat. No. 8,999,786.

(60) Provisional application No. 60/895,866, filed on Mar. 20, 2007.

(51) Int. Cl.
| | |
|---|---|
| *H01L 29/417* | (2006.01) |
| *H01L 29/792* | (2006.01) |
| *H01L 29/78* | (2006.01) |
| *H01L 29/423* | (2006.01) |
| *H01L 29/08* | (2006.01) |
| *H01L 27/115* | (2006.01) |
| *H01L 29/51* | (2006.01) |

(52) U.S. Cl.
CPC .... *H01L 29/41775* (2013.01); *H01L 27/11568* (2013.01); *H01L 29/0847* (2013.01); *H01L 29/4234* (2013.01); *H01L 29/513* (2013.01); *H01L 29/518* (2013.01); *H01L 29/7835* (2013.01); *H01L 29/792* (2013.01)

(58) Field of Classification Search
CPC ....................................................... H01L 21/027
USPC ................................... 257/324, 315; 438/261
See application file for complete search history.

(56) References Cited

U.S. PATENT DOCUMENTS

| 5,831,306 | A | * | 11/1998 | Gardner et al. ................ 257/344 |
|---|---|---|---|---|
| 6,104,064 | A | * | 8/2000 | Kadosh et al. ................ 257/344 |
| 2003/0008484 | A1 | | 1/2003 | Hook |
| 2005/0176207 | A1 | * | 8/2005 | Liu et al. ........................ 438/306 |
| 2008/0026529 | A1 | * | 1/2008 | White et al. ................... 438/275 |
| 2008/0109770 | A1 | | 5/2008 | Kim et al. |
| 2008/0173957 | A1 | | 7/2008 | Mathew et al. |
| 2008/0185634 | A1 | | 8/2008 | Li et al. |
| 2008/0296694 | A1 | | 12/2008 | Sonsky |
| 2008/0311717 | A1 | | 12/2008 | Bulucea |
| 2009/0029515 | A1 | | 1/2009 | Biery et al. |

OTHER PUBLICATIONS

Juang et al., "Effects of a lightly-doped drain (LDD) implantation condition on the device characteristics of polycrystalline-Si thin-film transistors," Semiconductor Science and Technology 21 (2006) Published Jan. 26, 2006, pp. 291-294.

\* cited by examiner

*Primary Examiner* — Walter H Swanson

(57) ABSTRACT

Methods and structures for transistors having reduced source contact to gate spacings in semiconductor devices are disclosed. In one embodiment, a method of forming a transistor can include: forming a gate over an active area of the transistor; forming source and drain regions aligned to the gate in the active area; forming source and drain contacts over the source and drain regions, where a spacing from the gate to the source contact of the transistor is less than a spacing from the gate to the drain contact of the transistor; and using one or more modified masks for forming doping profiles for the source region and the drain region.

20 Claims, 15 Drawing Sheets

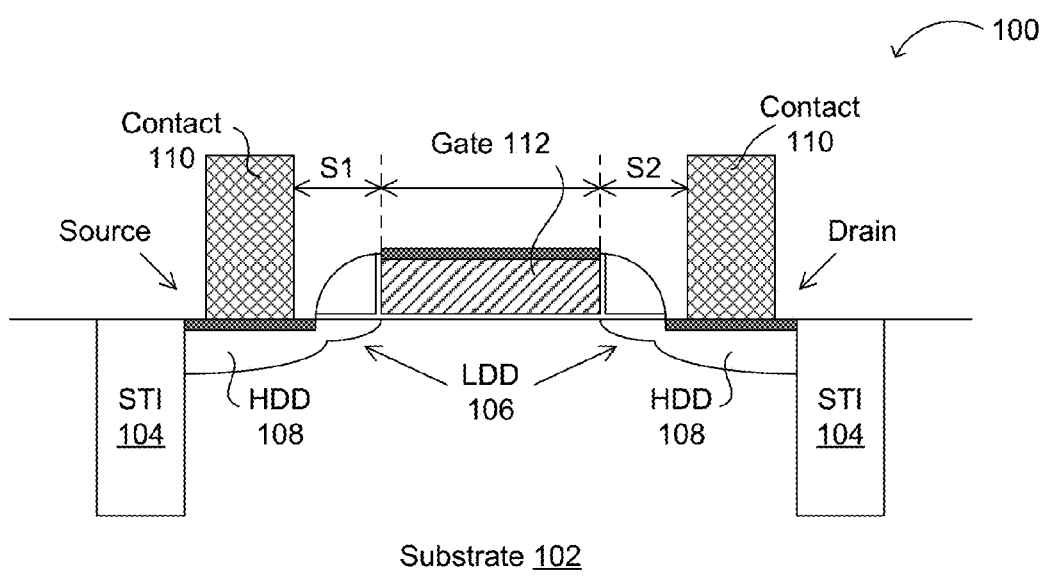
FIG. 1 (conventional)

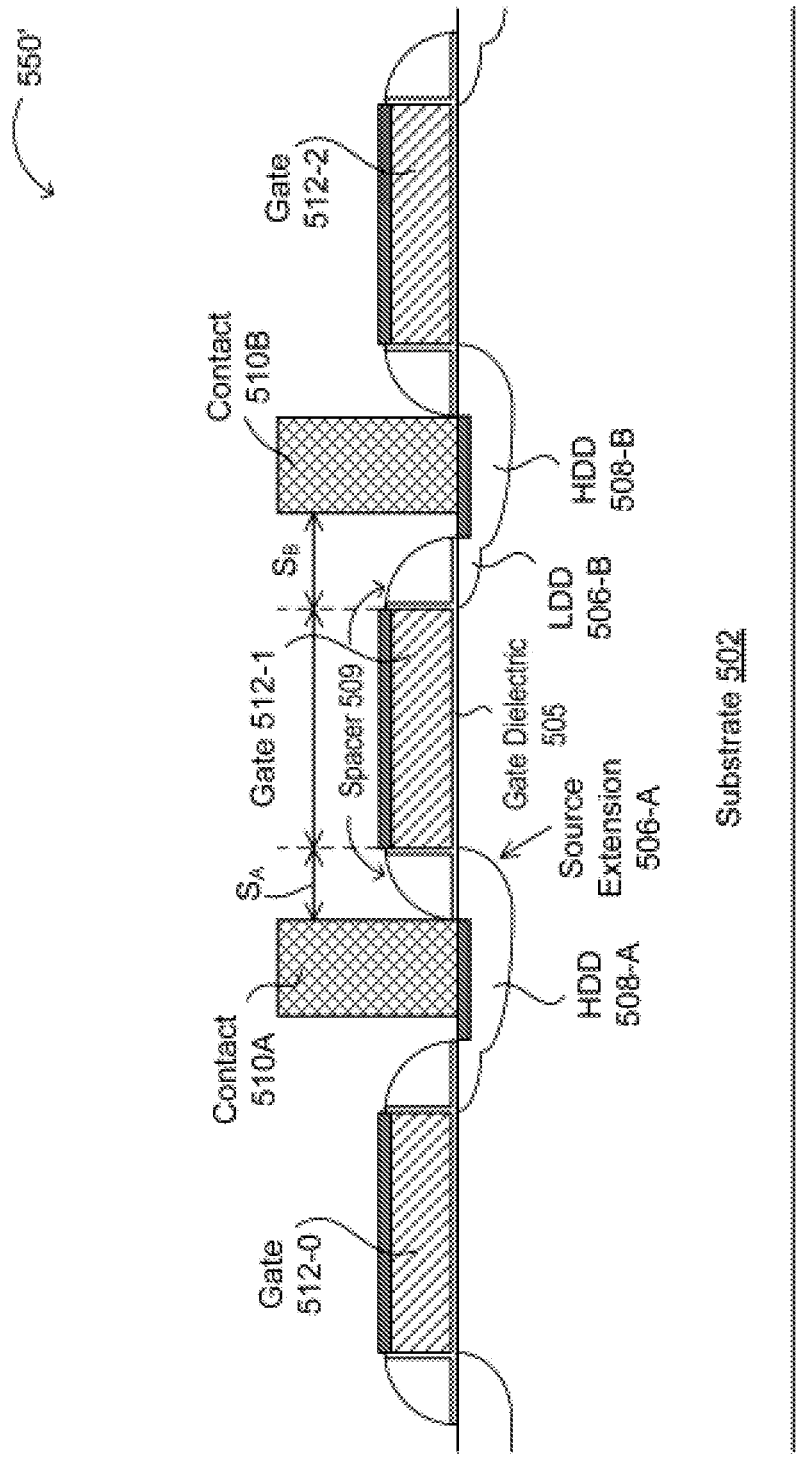

REDUCING SOURCE CONTACT TO GATE SPACING TO DECREASE TRANSISTOR PITCH

CROSS-REFERENCE TO RELATED APPLICATIONS

The present disclosure is a divisional of and claims priority to U.S. patent application Ser. No. 12/052,573, filed Mar. 20, 2008, now U.S. Pat. No. 8,999,786, issued Apr. 7, 2015, which claims the benefit of U.S. Provisional Application No. 60/895,866, filed Mar. 20, 2007, which are incorporated herein by reference.

FIELD

The present invention generally relates to the field of semiconductor devices. More specifically, embodiments of the present invention pertain to methods and structures for reduced transistor pitch within semiconductor devices.

DISCUSSION OF THE BACKGROUND

In modern semiconductor processing, transistor gate to contact spacing is a major limiting factor in achieving smaller pitch during scaling and/or shrinking of integrated circuits. Generally, a sufficiently large spacing between a contact and gate can overcome contact to gate alignment variations. When such spacing is relatively small, a lightly doped drain (LDD) may become connected to a contact due to alignment variations. As a result, there may be reliability concerns regarding hot electrons for NMOS devices or hot holes for PMOS devices.

FIG. 1 shows a cross-section view 100 of a conventional transistor structure. Shallow trench isolation (STI) portions 104 can surround a transistor active area in substrate 102. Source and drain doping profiles can include heavily doped drain (HDD) regions 108, and LDD regions 106. Source and drain contacts 110 can be spaced away from gate 112, where typically source side spacing "S1" is the same as drain side spacing "S2." Such gate to source/drain spacings can be a limiting factor in transistor pitches, such as in memory devices (e.g., word line decoders).

SUMMARY

Embodiments pertain to methods and structures for transistors having reduced source contact to gate spacings in semiconductor devices.

In one aspect, a method of forming a mask pattern can include: searching a layout for a source of a transistor, the source having a contact thereon, the contact being a first distance from a gate of the transistor; moving the contact to a second distance from the gate to form a modified layout, the second distance being less than the first distance; and printing the mask pattern using the modified layout.

The method of forming a mask pattern may also be configured to search the layout using computer aided design (CAD), to move an edge of an active region of the transistor by an amount up to about the first distance minus the second distance, to identify a contacted node having a ground or supply connection, and to identify a contacted node having a connection to a substrate or a well.

In another aspect, a method of forming a transistor can include: forming a gate over an active area of the transistor; forming source and drain regions aligned to the gate in the active area; forming source and drain contacts over the source and drain regions, where a spacing from the gate to the source contact of the transistor is less than a spacing from the gate to the drain contact of the transistor; and using one or more modified masks for forming doping profiles for the source region and the drain region.

The method of forming a transistor may also be configured with the one or more modified masks having a lightly doped drain (LDD) block on the source region and/or an LDD block on the drain region. The method may also be configured to form the doping profile for the source region by adding a heavily doped drain (HDD) portion, to form the doping profile for the drain using LDD and HDD portions, and/or to form the doping profile for the source by adding a source extension portion more heavily and/or more deeply doped than an LDD portion. The method may also be configured to form an isolation region around the active area of the transistor, and to form a word line decoder using the transistor.

In yet another aspect, a transistor structure can include: a gate on an active area of a transistor; source and drain regions aligned with the gate of the transistor; a source contact on the source region and a drain contact on the drain region, where a spacing between the source contact and the gate is less than a spacing between the drain contact and the gate; and a first doping profile for the source region and a second doping profile for the drain region.

The transistor structure may also be configured with a first doping profile having a first ITDD portion and a first LDD portion, a second doping profile having a second HDD portion and a second LDD portion, a first doping profile having a first HDD portion, a second doping profile having a second HDD portion and an LDD portion, a first doping profile having a first HDD portion and a modified source extension portion, and/or a second doping profile having a second HDD portion and a regular LDD portion.

In various embodiments, CAD procedures can be utilized to identify sources, and to move layouts of source contacts closer to corresponding transistor gates. In addition, source doping profiles can be adjusted using LDD approaches to accommodate the smaller spacing.

The present invention advantageously provides methods and structures for forming transistors having reduced source contact to gate spacing in a semiconductor device. Such methods and structures can be used to reduce a transistor pitch, thereby reducing an overall chip area. These and other advantages will become readily apparent from the detailed description below.

BRIEF DESCRIPTION OF THE DRAWINGS

FIG. 1 is a cross-section view diagram showing a conventional transistor structure.

FIG. 5C is a cross-section view diagram showing an exemplary reduced source contact to gate spacing in a multiple adjacent gate structure.

DETAILED DESCRIPTION

Reference will now be made in detail to various embodiments, examples of which are illustrated in the accompanying drawings. While the invention will be described in conjunction with the embodiments, the invention is not intended to be limited by these embodiments. On the contrary, the invention is intended to cover alternatives, modifications and equivalents that may be included within the scope of the invention as defined by the appended claims. Furthermore, in the following detailed description of the present invention, numerous specific details are set forth in order to provide a thorough understanding of the present invention. However, the present invention may be practiced without these specific details. In other instances, well-known methods, procedures, components, and circuits have not been described in detail so as not to unnecessarily obscure aspects of the present invention.

For the sake of convenience and simplicity, the terms "node(s)", "input(s)", and "output(s)" may be used interchangeably, as may the terms "connected to", "coupled with", "coupled to", and "in communication with" (which terms also refer to direct and/or indirect relationships between the connected, coupled and/or communicating elements, unless the context of the term's use unambiguously indicates otherwise), and in general, use of one such form generally includes the others, unless the context of the use unambiguously indicates otherwise. However, these terms are generally given their art recognized meanings.

The invention, in its various aspects, will be explained in greater detail below with regard to exemplary embodiments.

Exemplary Transistors

Figure 2:
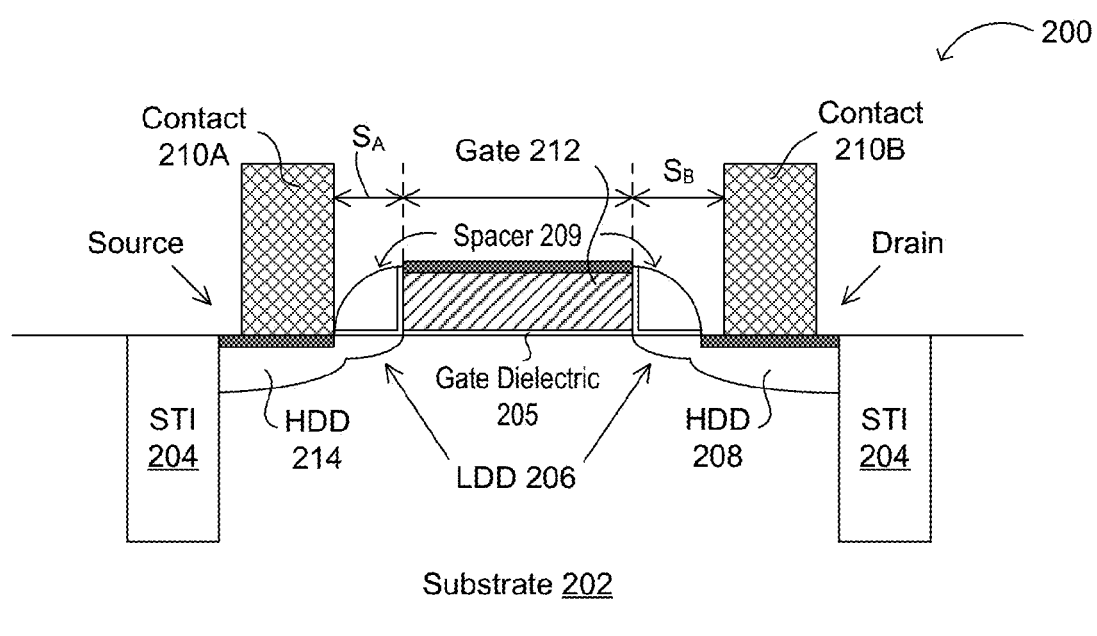
FIG. 2 is a cross-section view diagram showing an exemplary reduced source contact to gate spacing in a transistor.

FIG. 2 shows cross-section view 200 of an exemplary transistor having reduced source contact to gate spacing comprising shallow trench isolation (STI) regions 204 in a silicon substrate 202 that define a transistor active region, a gate 212 structure on an exposed surface of the silicon substrate in the transistor active region, source and drain regions 208 and 214 aligned to sidewalls of the gate having essentially the same doping profiles, a sidewall spacer 209 adjacent to the gate structure and source and drain contacts 210A and 210B on surfaces of source and drain regions 208 and 214, wherein a spacing $S_A$ from the gate 212 to the source contact 210A of the transistor is less than a spacing $S_B$ from the gate 212 to the drain contact 210B of the transistor.

Trenches can be formed in a silicon substrate 202 to define a transistor active area by dry etching the silicon substrate up to a predetermined depth using a photosensitive film pattern as a mask. Field oxide can be thermally grown or deposited such that the trenches are sufficiently filled to form shallow trench isolation (STI) regions 204. Alternatively, high density plasma (HDP) oxide can be deposited such that the trenches are sufficiently filled to form the STI regions 204. Oxygen can be implanted into the trench, or a liner oxide can be formed along the surfaces of the trench to reduce incidences of void formation in the STI and/or prevent leakage current. Impurity ions can also be implanted into the surfaces of the trenches to enhance the electrical isolation properties of the STI regions 204. The impurity ions may comprise antimony, arsenic, boron, and/or phosphorus. Chemical mechanical polishing (CMP) can be performed to planarize the oxide filling the trenches in the silicon substrate 202, and an annealing process can be performed to stabilize and/or compact the one or more oxides in the trenches. The annealing process may comprise furnace annealing and/or rapid thermal annealing. The shallow trench isolation (STI) regions 204 can surround the transistor active area in substrate 202.

A dielectric layer can be formed on the entire exposed surface of the silicon substrate 202 and patterned to form a gate dielectric 205. The dielectric layer may comprise one or more of the following: thermally grown oxide, silicon dioxide and/or silicon nitride deposited on the surface of the silicon substrate 202, and a high-k dielectric material (e.g., $Al_2O_3$, $HfO_2$, etc.) Alternatively, a floating gate structure comprising an oxide/nitride/oxide trilayer can be formed on the silicon substrate 202. A gate 212 comprising polysilicon or metal can be formed on the dielectric layer or floating gate structure. Source and drain regions 208 and 214 aligned to the gate 212 can be formed via one or more implantations of impurities ions into the exposed surfaces of the silicon substrate 202 as will be described in more detail with respect to FIGS. 3 and 4. On the drain side, highly doped drain (HDD) region 208 and lightly doped drain (LDD) region 206 can form a doping profile. The profile on the source side can include HDD 214 and LDD 206. Characteristics of alternative HDD, RDD/LDD, and/or LDD profiles on the source side in specific embodiments will be discussed in more detail below.

Sidewall spacers 209 aligned to the sidewalls of the gate 212 can be formed by depositing and etching one or more layers of dielectric material. Metal films can be deposited on the exposed surface of the silicon substrate 202 having source and drain regions 208 and 214 therein and the gate 212 to form metal salicides. Unreacted metal can be selectively removed by an etching process. An insulating interlayer dielectric (ILD) can be form over the silicon substrate 202 and the gate 212 by chemical vapor deposition (CVD). The ILD may comprise one or more layers of silicon dioxide (e.g., USG, plasma silane, TEOS, etc.), doped silicon oxide (e.g., FSG, BSG, PSG, BPSG, etc.) and/or silicon nitride. The ILD can be etched to expose surfaces of the gate 212 and the source and drain regions 208 and 214 to form contact holes. Conductive films can be deposited to fill the contact holes to form contacts 210 to the source and drain regions. The conductive films may comprise aluminum, copper, titanium, tungsten, and/or alloys thereof. An adhesion layer and/or a diffusion barrier layer may be formed along the surfaces of the contact holes before the contact holes are filled with the conductive films.

Generally, a smaller pitch transistor can be accommodated by minimizing the contact 210 to gate 212 spacing ($S_A$) on the source side. As discussed above, conventional approaches include the same spacing for both source and drain side contacts. However, in the particular example of FIG. 2, spacing $S_A$ may be less than spacing $S_B$, where drain side spacing $S_B$ can correspond to conventional approaches. Such source side spacing reductions can be accommodated because transistor drains typically have higher voltage level connections, and the hot carrier effects occur primarily on the drain transistor side. Accordingly, a design rule for spacing on the drain side may be created and followed, whereas such design rules can be more relaxed on the source side. For example, $S_B$ can be always greater than spacer width, but $S_A$ can be equal to spacer width.

Figure 3:
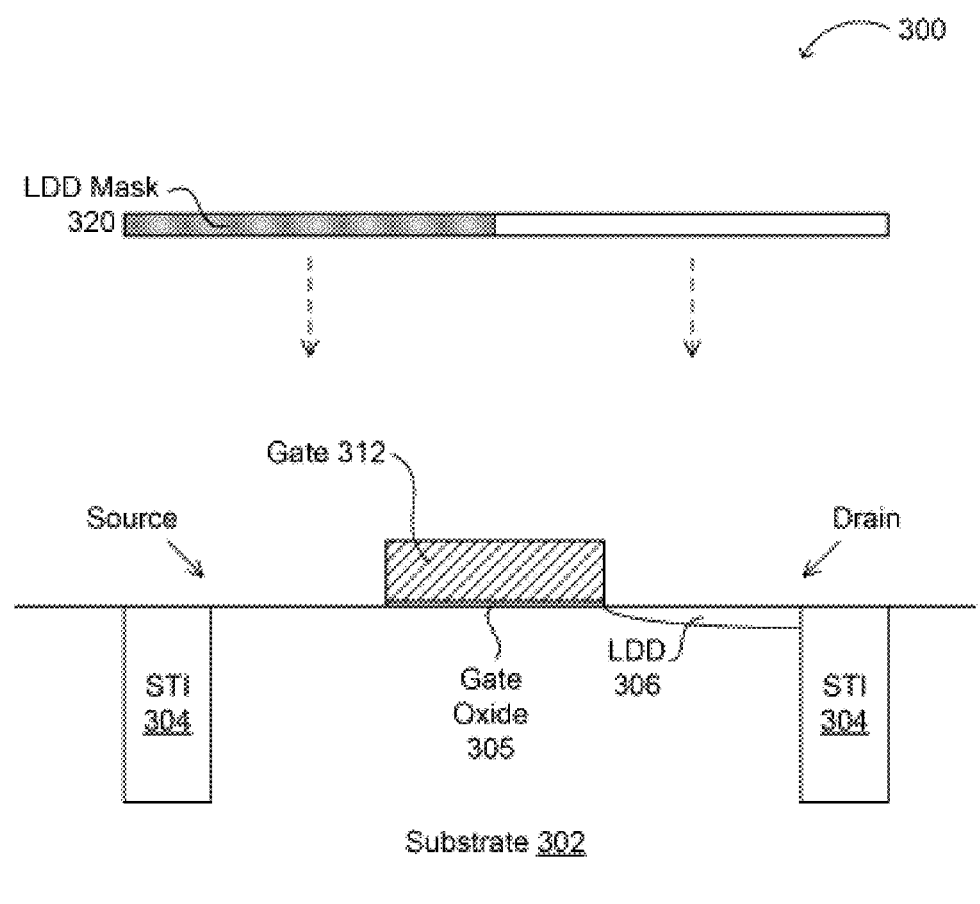
FIG. 3 is a cross-section view diagram showing exemplary LDD drain side masking.

FIG. 3 shows cross-section view 300 of exemplary LDD drain side masking. STI regions 304 can define a transistor active area in substrate 302, with gate 312 and gate oxide 305 thereon. In some embodiments, computer aided design (CAD) can be utilized to identify the source side of a transistor, and then to selectively minimize a spacing between the source contact and the gate 312. In one approach, a CAD logic operation can be utilized to generate a new mask for LDD, which excludes the LDD on the source-transistor side. For example, LDD mask 320 can be formed to block LDD formation on the source side, but to allow LDD 306 formation on the drain side. The LDD may comprise antimony, arsenic, boron, and/or phosphorus ions at a dose (for example) of approximately 3×1013 to 2×1014 per cm3, implanted at low energy (for example) of approximately 30 to 50 keV.

Figure 4:
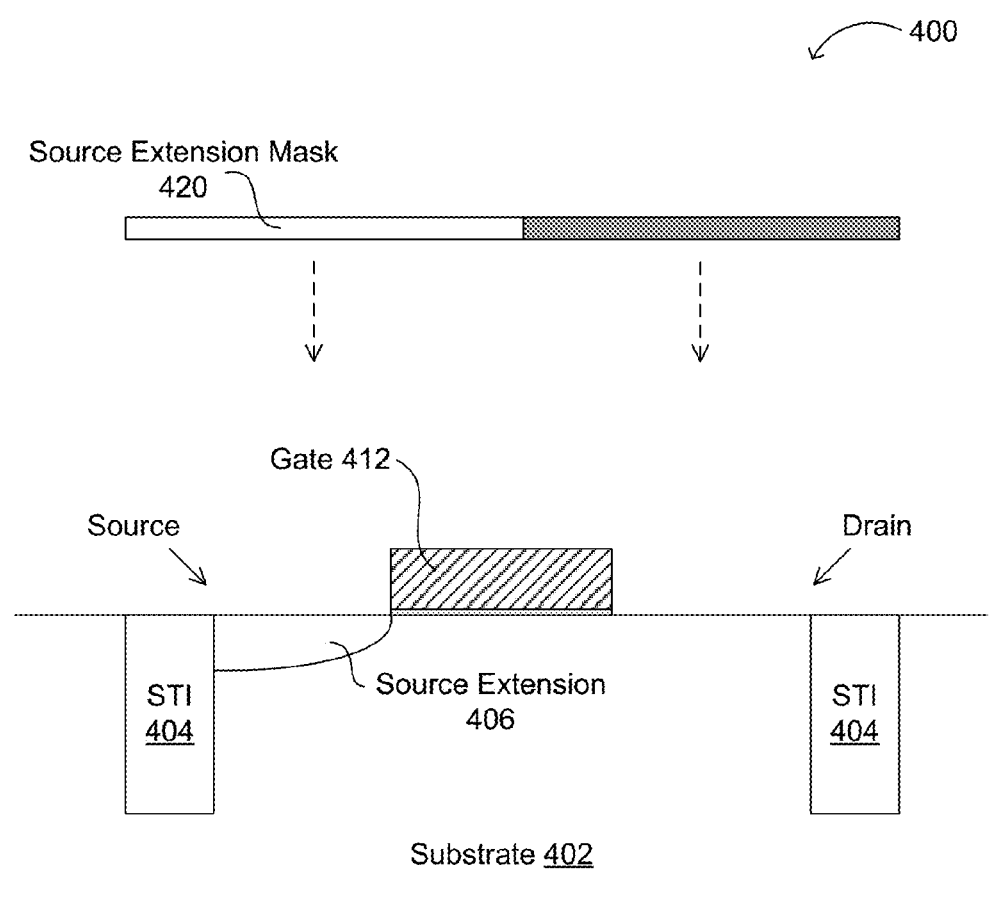
FIG. 4 is a cross-section view diagram showing an exemplary created LDD mask.

FIG. 4 shows cross-section view 400 of an exemplary created LDD mask. STI regions 404 can define a transistor active area in substrate 402, with gate 412 thereon. In this example, a CAD logic operation can be used to generate a new mask 420 to generate source extension portion 406. In this example, region 406 can be a relatively more heavily and/or more deeply doped version of LDD. Typically, a smaller source contact to gate spacing can also bring leakage and transistor reliability concerns, but such a heavily doped version of LDD (406) can address leakage and/or punch-through concerns to improve device performance and reliability. The source extension portion may comprise antimony, arsenic, boron, and/or phosphorus ions at a dose (for example) of approximately $1 \times 10^{15}$ to $4 \times 10^{15}$ per cm$^3$, implanted at energy (for example) of approximately 40 to 80 keV.

Figure 5A:
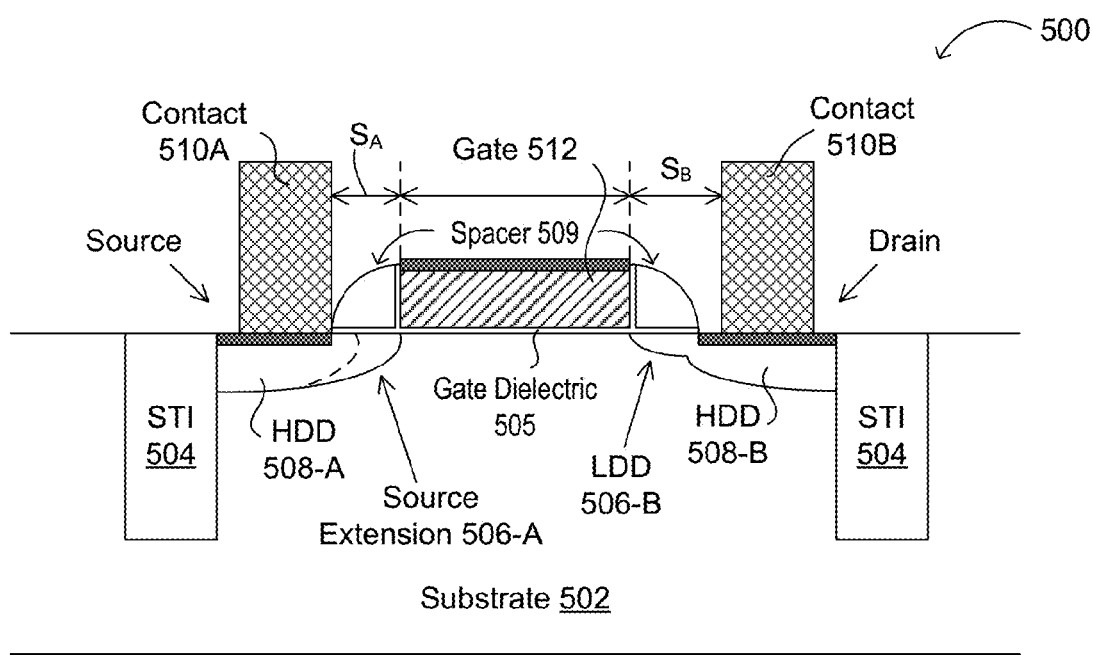
FIG. 5A is a cross-section view diagram showing an exemplary transistor structure formed using the mask shown in FIG. 4.

FIG. 5A shows cross-section view 500 of an exemplary transistor structure, comprising shallow trench isolation (STI) regions 504 in a silicon substrate 502 that define a transistor active region, a gate 512 structure on an exposed surface of the silicon substrate 502 in the transistor active region, source and drain HDD regions 508-A and 508-B aligned to sidewalls of the gate 512 having essentially one or more doping profiles using one or more modified masks for forming the doping profiles for the source HDD region 508-A and drain HDD region 508-B, sidewall spacers 509 adjacent to the gate 512 structure and source and drain contacts 510A and 510B on surfaces of the source and drain HDD regions 508-A and 508-B, wherein a spacing SA from the gate 512 to the source contact 510A of the transistor is less than a spacing SB from the gate 512 to the drain contact 510B of the transistor, the structure being formed using the masks shown in FIGS. 3 and 4.

Trenches can be formed in a silicon substrate 502 to define a transistor active area by dry etching the silicon substrate up to a predetermined depth using a photosensitive film pattern as a mask. Field oxide can be thermally grown or deposited such that the trenches are sufficiently filled to form shallow trench isolation (STI) regions 504. Alternatively, high density plasma (HDP) oxide can be deposited such that the trenches are sufficiently filled to form the STI regions 504. Oxygen can be implanted into the trench, or a liner oxide can be formed along the surfaces of the trench to reduce incidences of void formation in the STI and/or prevent leakage current. Impurity ions can also be implanted into the surfaces of the trenches to enhance the electrical isolation properties of the STI regions 504. The impurity ions may comprise antimony, arsenic, boron, and/or phosphorus. Chemical mechanical polishing (CMP) can be performed to planarize the oxide filling the trenches in the silicon substrate 502, and an annealing process can be performed to stabilize and/or compact the one or more oxides in the trenches. The annealing process may comprise furnace annealing and/or rapid thermal annealing. The shallow trench isolation (STI) regions 504 formed can surround the transistor active area in substrate 502.

A dielectric layer can be formed on the entire exposed surface of the silicon substrate 502 and patterned to form a gate dielectric 505. The dielectric layer may comprise one or more of the following: thermally grown oxide, silicon dioxide and/or silicon nitride deposited on the surface of the silicon substrate 502, or a high-k dielectric material (e.g., Al2O3, HfO2, etc.) Alternatively, a floating gate structure comprising an oxide/nitride/oxide trilayer can be formed on the silicon substrate 502. A gate 512 comprising polysilicon or metal can be formed on the dielectric layer or floating gate structure. Source and drain HDD regions 508-A and 508-B aligned to the gate 512 can be formed via one or more implantations of impurities ions into the exposed surfaces of the silicon substrate 502 in accordance with FIGS. 3 and 4. In FIG. 5A, source side contact 510A to gate 512 spacing (SA) can be less than drain side contact 510B to gate 512 spacing (SB). Also, the source side doping profile in substrate 502 between gate 512 and STI 504 can include HDD 508-A and source extension region 506-A, while the drain side doping profile between gate 512 and STI 504 can include HDD 508-B and LDD 506-B. In this fashion, a transistor having a pitch as low as a width of contact 510 plus a gate 512 width plus SA plus SB can be formed.

Sidewall spacers 509 aligned to the sidewalls of the gate 512 can be formed by depositing and etching one or more layers of dielectric material. Metal films can be deposited on the exposed surface of the silicon substrate 502 having source and drain HDD regions 508-A and 508-B therein and the gate 512 to form metal salicides. Unreacted metal can be selectively removed by an etching process. An insulating interlayer dielectric (ILD) can be form over the silicon substrate 502 and the gate 512 by chemical vapor deposition (CVD). The ILD may comprise one or more layers of silicon dioxide (e.g., USG, plasma silane, TEOS, etc.), doped silicon oxide (e.g., FSG, BSG, PSG, BPSG, etc.) and/or silicon nitride. The ILD can be etched to expose surfaces of the gate 512 and the source and drain HDD regions 508-A and 508-B to form contact holes. Conductive films can be deposited to fill the contact holes to form contacts 510 to the source and drain regions. The conductive films may comprise aluminum, copper, titanium, tungsten, and/or alloys thereof. An adhesion layer and/or a diffusion barrier layer may be formed along the surfaces of the contact holes before the contact holes are filled with the conductive films.

Figure 5B:
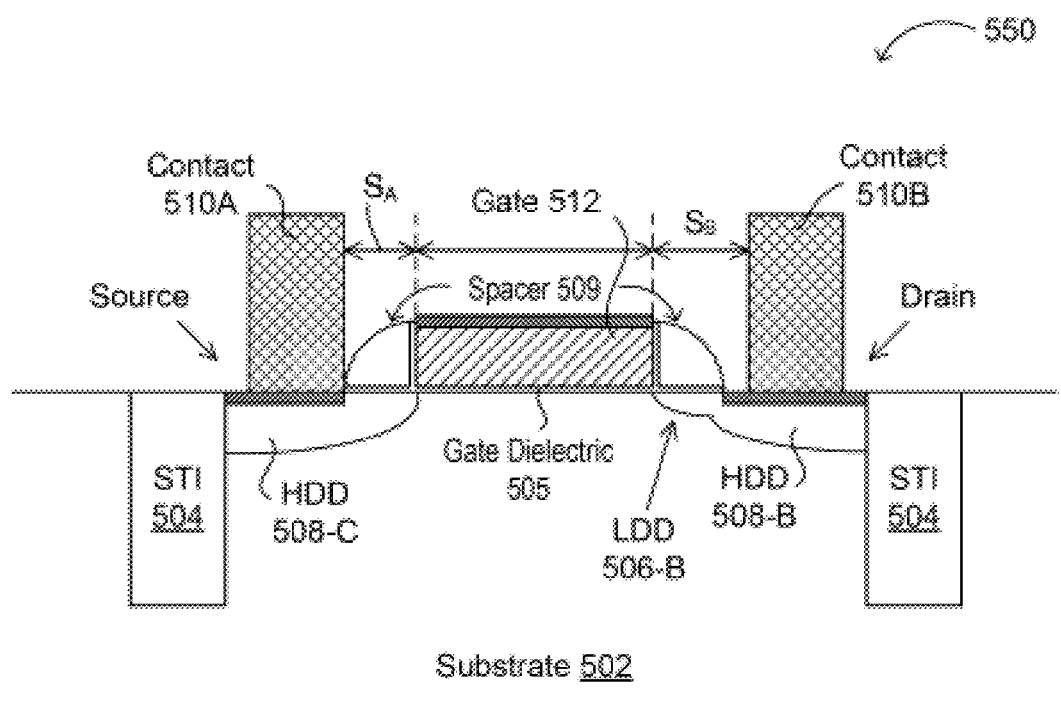
FIG. 5B is a cross-section view diagram showing another exemplary transistor structure formed using the mask shown in FIG. 3.

FIG. 5b shows cross-sectional view 550 of an exemplary transistor structure in accordance with an alternative doping profile. In this particular example, the doping profile on the source side includes only HDD region 508-C. HDD region 508-C has substantially similar dopant type, dose, and depth characteristics as HDD region 508-A in FIG. 5A, but HDD region 508-C is formed using the source extension mask of FIG. 4 (e.g., at the time of forming source extension 406 in FIG. 4). Thus, HDD region 508-C is aligned with a source-side sidewall of the gate 512. Subsequent implantation to form drain-side HDD region 508-B can also re-implant HDD region 508-C, or the source/drain implant mask (not shown) can block re-implantation of impurity ions into HDD region 508-C.

FIG. 5C shows a cross-section view 550' of an exemplary reduced source contact-to-gate spacing in a multiple adjacent gate structure. In this particular example, STI regions are not included in a series transistor structure (e.g., a NAND gate discharge path) with gates 512-0, 512-1, and 512-2. Similar to the example of FIG. 5A, spacing SA may be less than spacing SB, as shown. In order to identify such multiple adjacent gate structures, computer aided design (CAD) can be used. For example, NAND gate discharge paths, NOR gate charge paths, or other such series-connected transistors, can be identified for selective space minimization between appropriate gates and diffusion region contacts.

Figure 6:
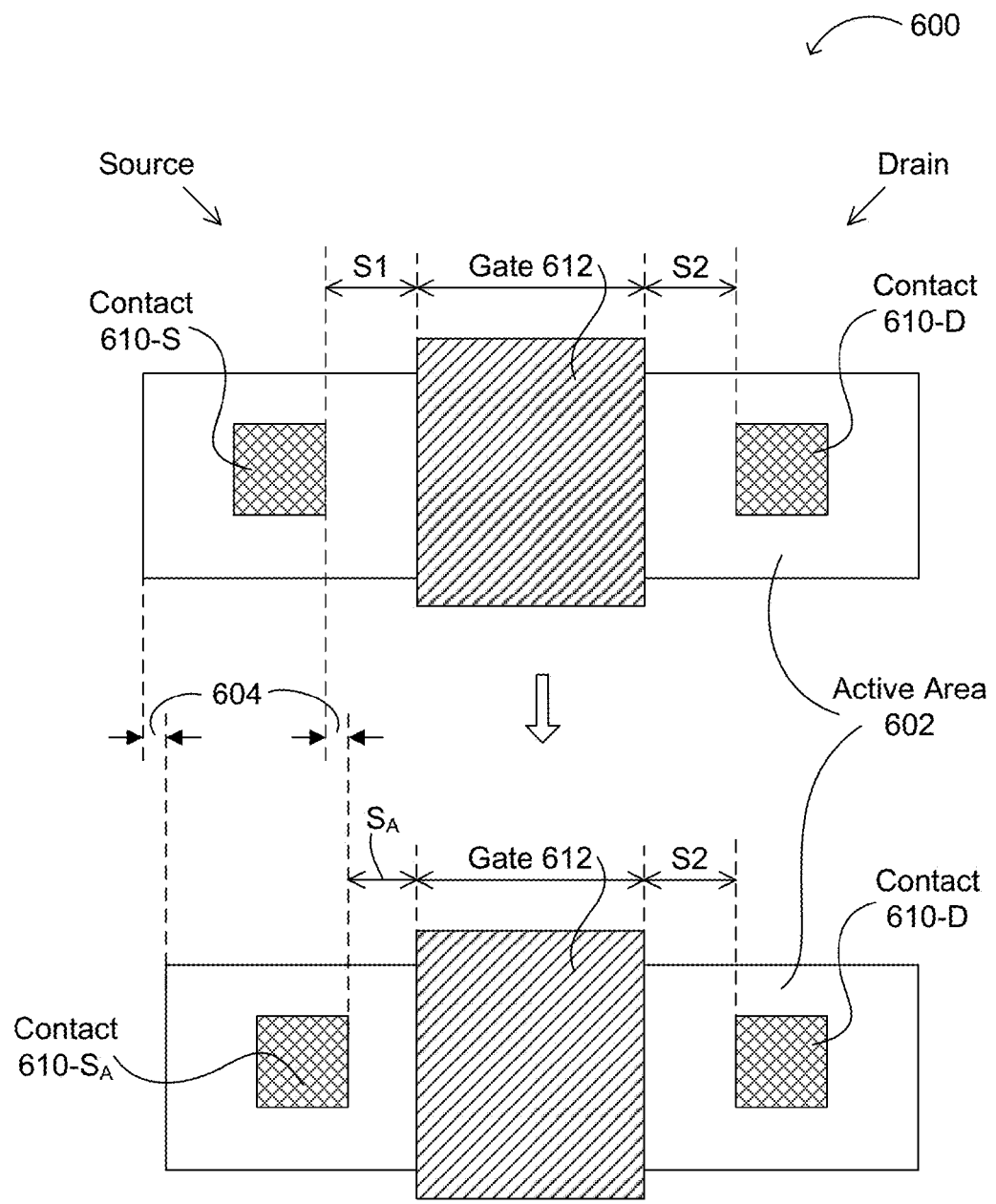
FIG. 6 is a top level layout view diagram showing an exemplary CAD layout modification for mask formation.

FIG. 6 shows top level layout view 600 of an exemplary CAD layout modification for mask formation. An initial layout can be shown in the upper diagram portion, and may include source contact 610-S, gate 612, and drain contact 610-D, over active area 602. An initial source contact 610-S to gate 612 spacing may be SI, while the initial drain contact 610-D to gate 612 spacing may be S2. Once a source side has been identified in a CAD operation, a further CAD modification can include reducing a source side contact to gate spacing, as shown in the lower diagram portion. For example, drain side spacing S2 from contact 610-D to gate 612 may remain S2, but the source side spacing can be reduced from S1 to $S_A$ by replacing initial contact 610-S with new or moved contact 610-$S_A$. In this fashion, a pitch of the transistor can be reduced as shown by distance 604.

Exemplary Methods

Figure 7:
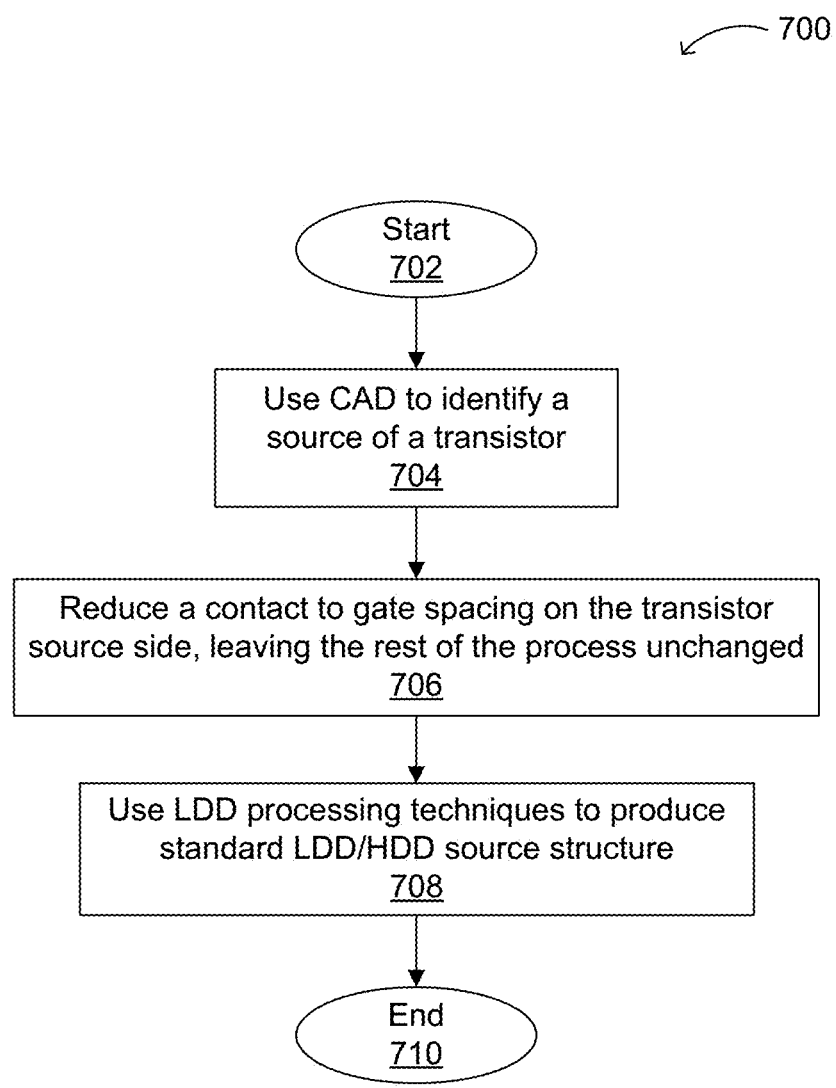
FIG. 7 is a flow diagram showing an exemplary method of performing a CAD operation for a reduced source contact to gate spacing transistor structure.

FIG. 7 shows flow 700 of an exemplary method of performing a CAD operation for a reduced source contact to gate spacing transistor structure. The flow can begin (702), and a CAD operation can be used to identify a source of a transistor (704). Other CAD options can identify ground potentials, a power supply, a well, gates, substrate, and other suitable connections, and the transistor sources can be identified from such information. A contact to gate spacing on a transistor source side can then be defined, adjusted, or reduced, leaving the rest of the process unchanged (706). LDD processing techniques as described above can then be utilized to produce a standard LDD/HDD source or doping profile (708), and the flow can complete (710). For example, this approach can be used to form a transistor structure as shown above in FIG. 2.

Figure 8:
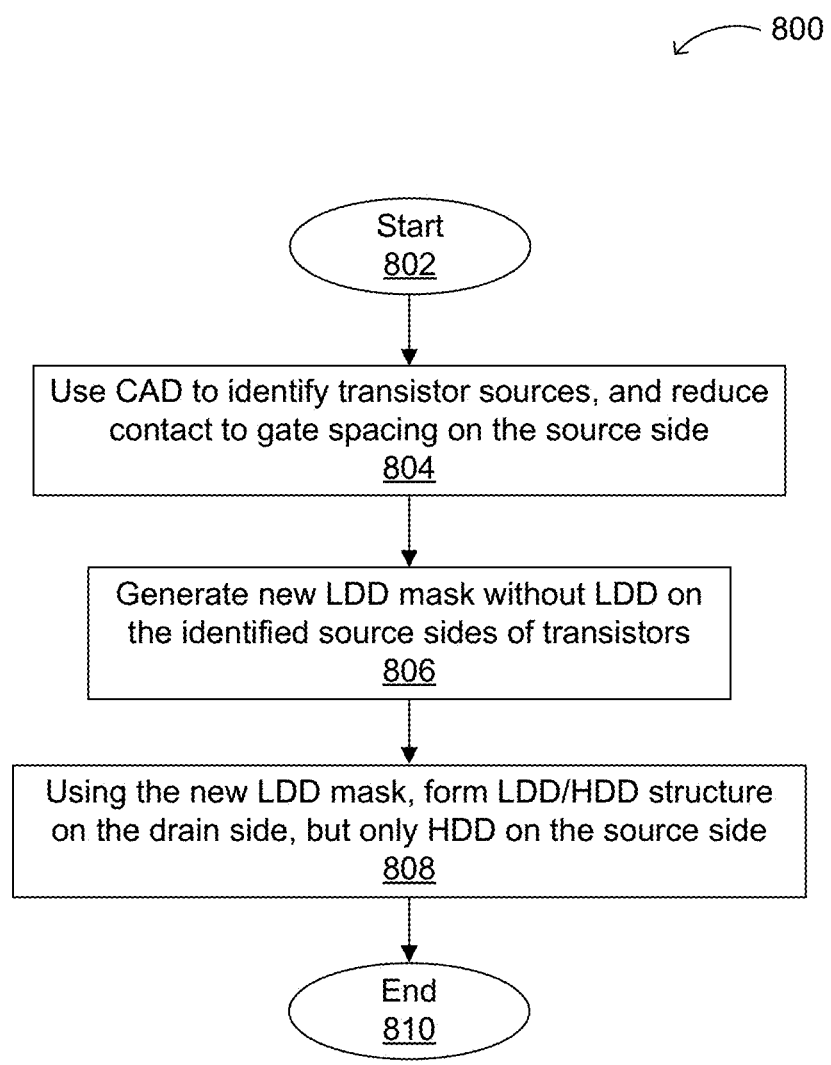
FIG. 8 is a flow diagram showing an exemplary method of utilizing source LDD masking to form a transistor structure.

FIG. 8 shows flow 800 of an exemplary method of utilizing source LDD masking to form a transistor structure. The flow can begin (802), and a CAD operation can be used to identify transistor sources, and to reduce a contact to gate spacing thereon (804). A new LDD mask without LDD coverage on the identified source transistor sides can be generated (806). Using a new LDD mask, an LDD/HDD structure can be formed on the drain side, where the transistor can include only HDD on the source side (808), and the flow can complete (810). For example, this approach can be used to form a transistor structure of which is shown above in FIG. 5C, the LDD portion on the drain side of which are as shown above in FIG. 3.

Figure 9:
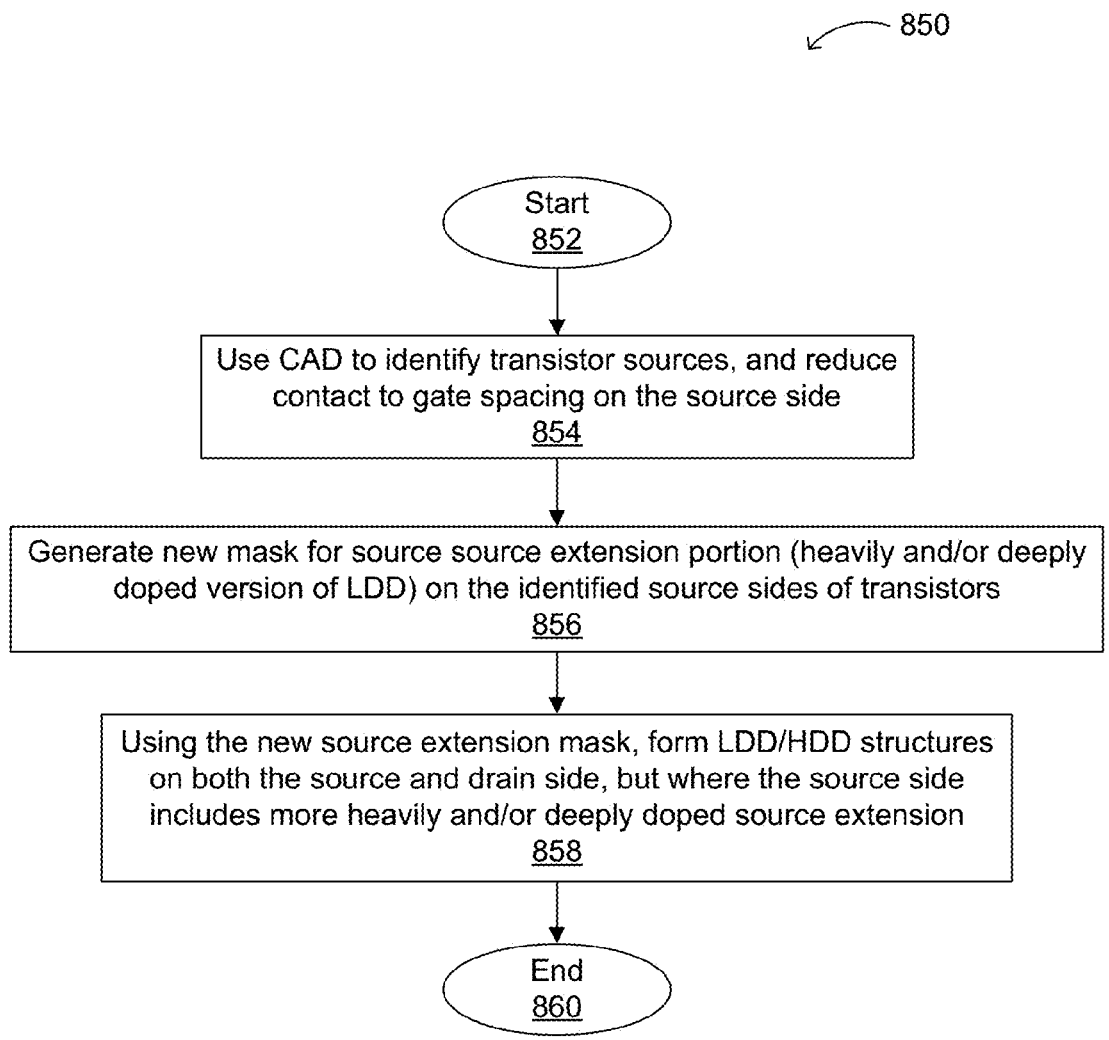
FIG. 9 is a flow diagram showing an exemplary method of utilizing a created LDD mask for application in forming a transistor structure.

FIG. 9 shows flow 850 of an exemplary method of utilizing a created LDD mask for application in forming a transistor structure. The flow can begin (852), and CAD can be used to identify transistor sources, and to reduce source side contact to gate spacing thereon (854). A new mask for source extension portion (e.g., a heavily and/or deeply doped version of LDD) can be generated on the identified source transistor sides (856). Using the new source extension mask, LDD/HDD structures can be formed on both source and drain sides, but where the source sides include more heavily and or deeply doped source extension portion (858), and the flow can complete (860). For example, this approach can be used in forming the transistor structures shown above in FIGS. 4 and 5.

Exemplary Systems Using the Present Circuit

In a further aspect of the invention, a system may comprise the present apparatus or circuit to form a word line decoder for controlling memory devices. Various exemplary implementations of the present invention are shown in FIGS. 10A-10G.

Figure 10A:
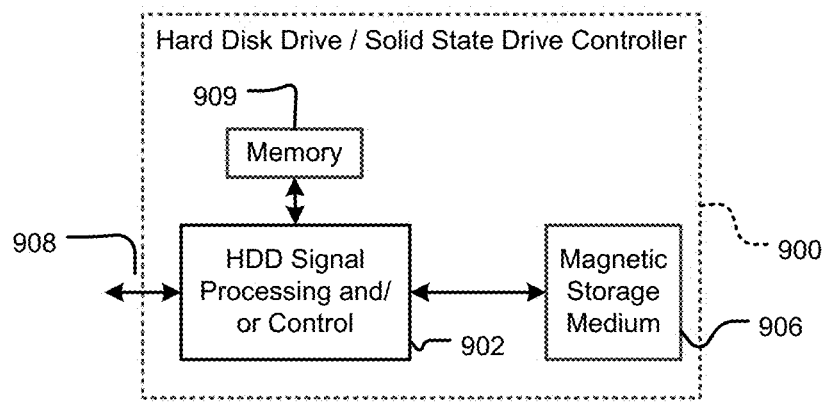
FIG. 10A is a diagram of an exemplary hard disk drive (HDD)/solid state drive (SSD) controller.

Referring now to FIG. 10A, the present invention can be implemented in a hard disk drive (HDD) or solid state drive (SSD) controller 900. The present invention may implement either or both signal processing and/or control circuits, which are generally identified in FIG. 10A at 902. In some implementations, the signal processing and/or control circuit 902 and/or other circuits (not shown) in the HDD/SSD 900 may process data, perform coding and/or encryption, perform calculations, and/or format data that is output to and/or received from a magnetic or solid state storage medium 906.

The HDD/SSD controller 900 may communicate with a host device such as a computer, mobile computing device such as personal digital assistants, cellular phones, media or MP3 players and the like, and/or other devices via one or more wired or wireless communication links 908. The HDD/SSD controller 900 may be connected to memory 909 such as random access memory (RAM), low latency nonvolatile memory such as flash memory, read only memory (ROM) and/or other suitable electronic data storage.

Figure 10B:
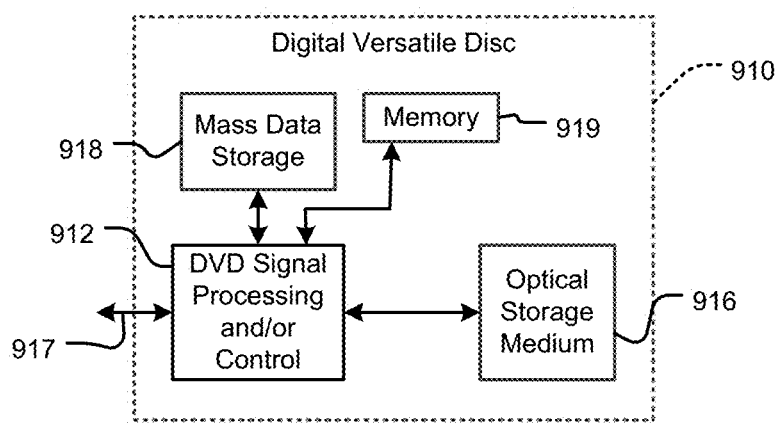
FIG. 10B is a diagram of an exemplary digital versatile disk (DVD) player.

Referring now to FIG. 10B, the present invention can be implemented in a digital versatile disc (DVD) drive 910. The present invention may implement either or both signal processing and/or control circuits, which are generally identified in FIG. 10B at 912, and/or mass data storage 918 of the DVD drive 910. The signal processing and/or control circuit 912 and/or other circuits (not shown) in the DVD drive 910 may process data, perform coding and/or encryption, perform calculations, and/or format data that is read from and/or data written to an optical storage medium 916. In some implementations, the signal processing and/or control circuit 912 and/or other circuits (not shown) in the DVD drive 910 can also perform other functions such as encoding and/or decoding and/or any other signal processing functions associated with a DVD drive.

The DVD drive 910 may communicate with an output device (not shown) such as a computer, television or other device via one or more wired or wireless communication links 917. The DVD drive 910 may communicate with mass data storage 918 that stores data in a nonvolatile manner. The mass data storage 918 may include a HDD and/or SSD. The HDD/SDD may comprise a HDD/SSD controller that have the configuration shown in FIG. 10A. The HDD may be a mini MD that includes one or more platters having a diameter that is smaller than approximately 1.8". The DVD drive 910 may be connected to memory 919 such as RAM, ROM, low latency nonvolatile memory such as flash memory and/or other suitable electronic data storage.

Figure 10C:
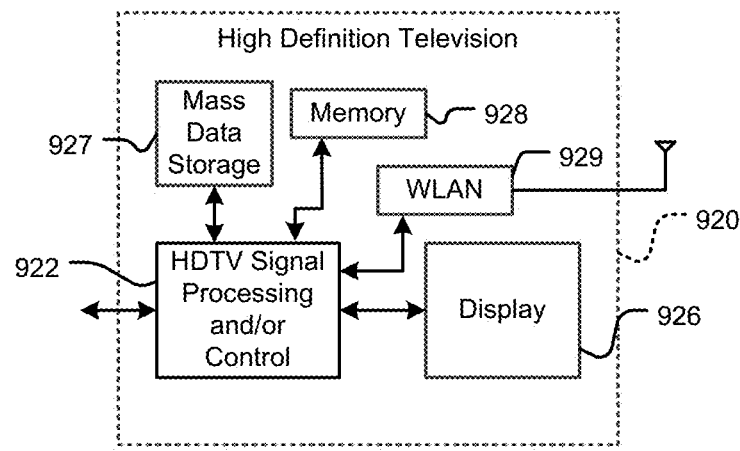
FIG. 10C is a diagram of an exemplary high definition television (HDTV).

Referring now to FIG. 10C, the present invention can be implemented in a high definition television (HDTV) 920. The present invention may implement either or both signal processing and/or control circuits, which are generally identified in FIG. 10C at 922, a WLAN network interface 929 and/or mass data storage of the HDTV 920. The HDTV 929 receives HDTV input signals in either a wired or wireless format and generates HDTV output signals for a display 926. In some implementations, signal processing circuit and/or control circuit 922 and/or other circuits (not shown) of the HDTV 920 may process data, perform coding and/or encryption, perform calculations, format data and/or perform any other type of HDTV processing that may be required.

The HDTV 920 may communicate with mass data storage 927 that stores data in a nonvolatile manner such as optical, solid state and/or magnetic storage devices (for example, hard disk drives [HDDs], solid state drives [SSDs] and/or DVD drives). At least one HDD/SSD may comprise a HDD/SSD controller that has the configuration shown in FIG. 10A and/or at least one DVD drive may have the configuration shown in FIG. 10B. The HDD may be a mini HDD that includes one or more platters having a diameter that is smaller than approximately 1.8". The HDTV 920 may be connected to memory 928 such as RAM, ROM, low latency nonvolatile memory such as flash memory and/or other suitable electronic data storage. The HDTV 920 also may support connections with a WLAN via WLAN network interface 929.

Figure 10D:
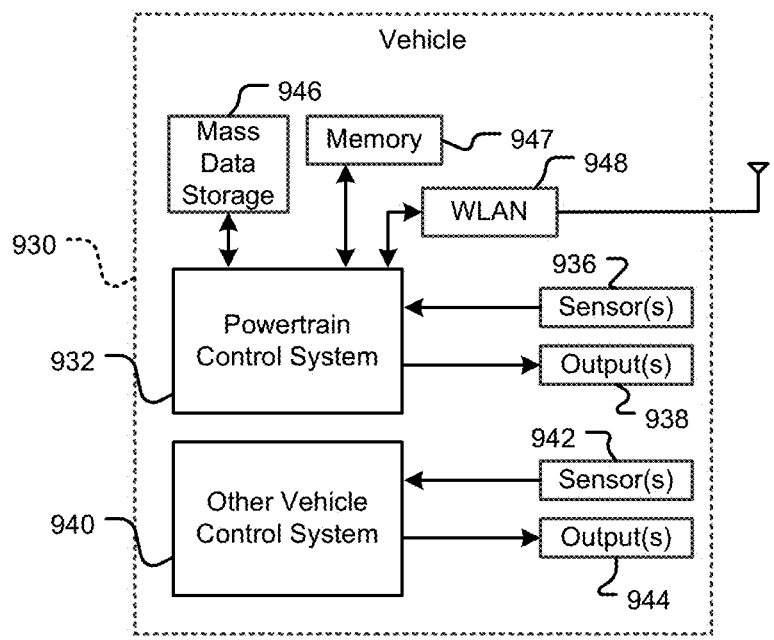
FIG. 10D is a diagram of an exemplary vehicle.

Referring now to FIG. 10D, the present invention can be implemented in a control system of a vehicle 930, a WLAN network interface 948 and/or mass data storage 946 of the vehicle 930. In some implementations, the present invention implement a powertrain control system 932 that receives inputs from one or more sensors such as temperature sensors, pressure sensors, rotational sensors, airflow sensors and/or any other suitable sensors and/or that generates one or more output control signals such as engine operating parameters, transmission operating parameters, braking parameters, and/or other control signals.

The present invention may also be implemented in other control systems 940 of the vehicle 930. The control system 940 may likewise receive signals from input sensors 942 and/or output control signals to one or more output devices 944. In some implementations, the control system 940 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 932 may communicate with mass data storage 946 that stores data in a nonvolatile manner. The mass data storage 946 may include optical, solid state and/or magnetic storage devices (for example, hard disk drives [RDDs], solid state drives [SSDs] and/or DVD drives). At least one HDD/SSD may comprise a HDD/SSD controller that have the configuration shown in FIG. 10A and/or at least one DVD drive may have the configuration shown in FIG. 10B. The HDD may be a mini HDD that includes one or more platters having a diameter that is smaller than approximately 1.8". The powertrain control system 932 may be connected to memory 947 such as RAM, ROM, low latency nonvolatile memory such as flash memory and/or other suitable electronic data storage. The powertrain control system 932 also may support connections with a WLAN via WLAN network interface 948. The control system 940 may also include mass data storage, memory and/or a WLAN network interface (all not shown).

Figure 10E:
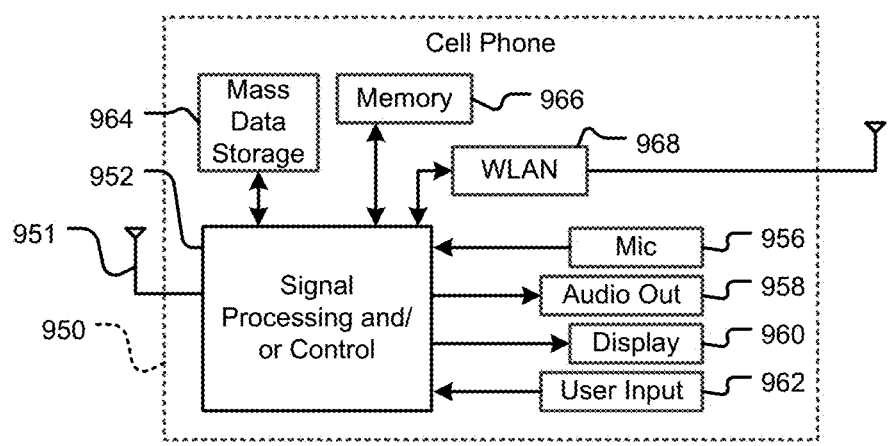
FIG. 10E is a diagram of an exemplary cellular or mobile phone.

Referring now to FIG. 10E, the present invention can be implemented in a cellular phone 950 that may include a cellular antenna 951. The present invention may implement either or both signal processing and/or control circuits, which are generally identified in FIG. 10E at 952, a WLAN network interface 968 and/or mass data storage 964 of the cellular phone 950. In some implementations, the cellular phone 950 includes a microphone 956, an audio output 958 such as a speaker and/or audio output jack, a display 960 and/or an input device 962 such as a keypad, pointing device, voice actuation and/or other input device. The signal processing and/or control circuits 952 and/or other circuits (not shown) in the cellular phone 950 may process data, perform coding and/or encryption, perform calculations, format data and/or perform other cellular phone functions.

The cellular phone 950 may communicate with mass data storage 964 that stores data in a nonvolatile manner such as optical, solid state and/or magnetic storage devices (for example, hard disk drives [HDDs], solid state drives [SSDs] and/or DVD drives). At least one HDD/SDD may comprise a HDD/SSD controller that have the configuration shown in FIG. 10A and/or at least one DVD drive may have the configuration shown in FIG. 10B. The HDD may be a mini HDD that includes one or more platters having a diameter that is smaller than approximately 1.8". The cellular phone 950 may be connected to memory 966 such as RAM, ROM, low latency nonvolatile memory such as flash memory and/or other suitable electronic data storage. The cellular phone 950 also may support connections with a WLAN via WLAN network interface 968.

Figure 10F:
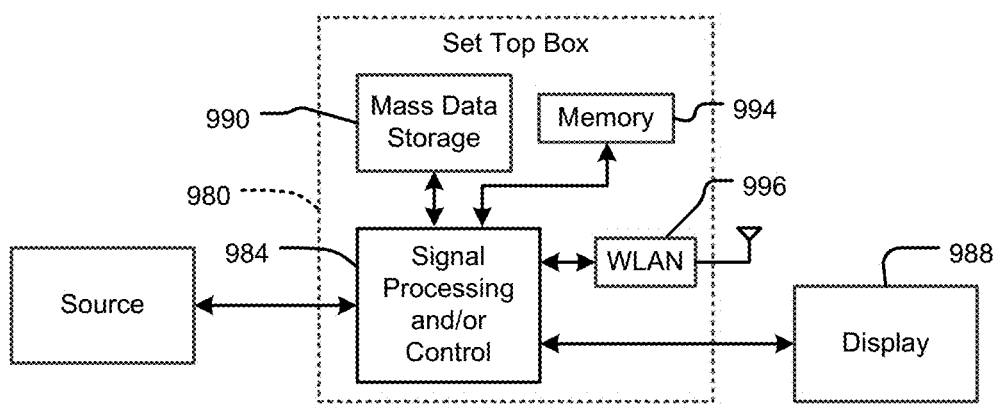
FIG. 10F is a diagram of an exemplary television set top box.

Referring now to FIG. 10F, the present invention can be implemented in a set top box 980. The present invention may implement either or both signal processing and/or control circuits, which are generally identified in FIG. 10F at 984, a WLAN network interface 996 and/or mass data storage 990 of the set top box 980. The set top box 980 receives signals from a source such as a broadband source and outputs standard and/or high definition audio/video signals suitable for a display 988 such as a television and/or monitor and/or other video and/or audio output devices. The signal processing and/or control circuits 984 and/or other circuits (not shown) of the set top box 980 may process data, perform coding and/or encryption, perform calculations, format data and/or perform any other set top box function.

The set top box 980 may communicate with mass data storage 990 that stores data in a nonvolatile manner. The mass data storage 990 may include optical, solid state and/or magnetic storage devices (for example, hard disk drives [HDDs], solid state drives [SSDs] and/or DVD drives). At least one HDD/SSD may comprise a HDD/SSD controller that have the configuration shown in FIG. 10A and/or at least one DVD drive may have the configuration shown in FIG. 10B. The HDD may be a mini HDD that includes one or more platters having a diameter that is smaller than approximately 1.8". The set top box 980 may be connected to memory 994 such as RAM, ROM, low latency nonvolatile memory such as flash memory and/or other suitable electronic data storage. The set top box 980 also may support connections with a WLAN via WLAN network interface 996.

Figure 10G:
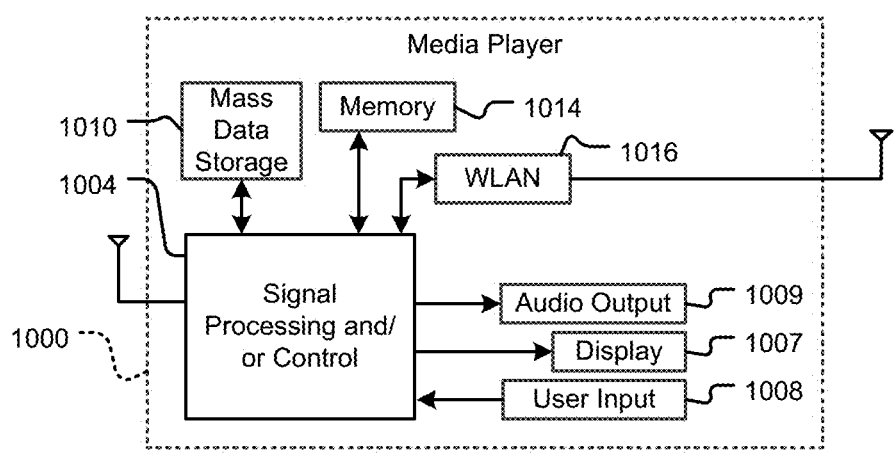
FIG. 10G is a diagram of an exemplary portable media player.

Referring now to FIG. 10G, the present invention can be implemented in a media player 1000. The present invention may implement either or both signal processing and/or control circuits, which are generally identified in FIG. 10G at 1004, a WLAN network interface 1016 and/or mass data storage 1010 of the media player 1000. In some implementations, the media player 1000 includes a display 1007 and/or a user input 1008 such as a keypad, touchpad and the like. In some implementations, the media player 1000 may employ a graphical user interface (GUI) that typically employs menus, drop down menus, icons and/or a point-and-click interface via the display 1007 and/or user input 1008. The media player 1000 further includes an audio output 1009 such as a speaker and/or audio output jack. The signal processing and/or control circuits 1004 and/or other circuits (not shown) of the media player 1000 may process data, perform coding and/or encryption, perform calculations, format data and/or perform any other media player function.

The media player 1000 may communicate with mass data storage 1010 that stores data such as compressed audio and/or video content in a nonvolatile manner. In some implementations, the compressed audio files include files that are compliant with MP3 format or other suitable compressed audio and/or video formats. The mass data storage 1010 may include optical, solid state and/or magnetic storage devices (for example, hard disk drives [HDDs], solid state drives [SSDs] and/or DVD drives). At least one FIDD/SSD may comprise a HDD/SSD controller that have the configuration shown in FIG. 10A and/or at least one DVD drive may have the configuration shown in FIG. 10B. The HDD may be a mini HDD that includes one or more platters having a diameter that is smaller than approximately 1.8". The media player 1000 may be connected to memory 1014 such as RAM, ROM, low latency nonvolatile memory such as flash memory and/or other suitable electronic data storage. The media player 1000 also may support connections with a WLAN via WLAN network interface 1016. Still other implementations in addition to those described above are contemplated.

CONCLUSION/SUMMARY

Thus, the present invention provides structures and methods for transistors having reduced source contact to gate spacings in semiconductor devices. In particular, embodiments of the present invention provide a transistor structure having a source doping profile accommodating reduced source contact to gate spacings.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A transistor structure comprising:
a gate formed on an active area of the transistor structure;
a source region comprising a first portion, wherein the first portion of the source region has a first doping profile;
a drain region comprising a second portion, wherein the second portion of the drain region has a second doping profile, wherein the first doping profile of the first portion of the source region is deeper than the second doping profile of the second portion of the drain region such that the first portion of the source region is more heavily doped than the second portion of the drain region;
a source contact formed on the source region; and
a drain contact formed on the drain region.

2. The transistor structure of claim 1, wherein the first portion of the source region is a source extension portion.

3. The transistor structure of claim 2, wherein the second portion of the drain region is lightly doped drain (LDD) portion.

4. The transistor structure of claim 3, wherein:
the source region further comprises a first heavily doped drain (HDD) portion that is different from the first portion of the source region.

5. The transistor structure of claim 4, wherein:
the drain region further comprises a second heavily doped drain (HDD) portion that is different from the second portion of the drain region.

6. The transistor structure of claim 1, wherein the first portion of the source region is a heavily doped drain (HDD) portion.

7. The transistor structure of claim 1, wherein a spacing between the source contact and the gate is less than a spacing between the drain contact and the gate.

8. The transistor structure of claim 1, wherein:
the second portion of the drain region is formed using a first mask blocking the source region; and
the first portion of the source region is formed using a second mask blocking the drain region.

9. The transistor structure of claim 1, further comprising:
an isolation region around the active area of the transistor structure.

10. The transistor structure of claim 1, wherein the gate further comprises a floating gate structure.

11. The transistor structure of claim 10, wherein the floating gate structure comprises an oxide-nitride-oxide (ONO) layer.

12. The transistor structure of claim 1, further comprising:
sidewall spacers aligned to sidewalls of the gate.

13. The transistor structure of claim 1, wherein each of the first portion and the second portion comprise one or more of antimony, arsenic, and phosphorus ions.

14. The transistor structure of claim 13, wherein the second portion comprises one or more of antimony, arsenic, and phosphorus ions at a dose of about $3\times10^{13}$ to about $2\times10^{14}$ per $cm^3$.

15. The transistor structure of claim 14, wherein the first portion comprises one or more of antimony, arsenic, and phosphorus ions at a dose of about $1\times10^{15}$ to about $4\times10^{15}$ per $cm^3$.

16. The transistor structure of claim 1, wherein:
the first portion is formed by implanting impurities at a first energy; and
the second portion is formed by implanting impurities at a second energy,
wherein the first energy is substantially higher than the second energy.

17. The transistor structure of claim 16, wherein:
the first energy is about 40 to about 80 keV; and
the second energy is about 30 to about 50 keV.

18. The transistor structure of claim 1, wherein each of the first portion and the second portion comprise boron ions.

19. The transistor structure of claim 1, further comprising:
a first sidewall spacer that is (i) aligned to a first sidewall of the gate and (ii) disposed between the gate and the source contact; and
a second sidewall spacer that is (i) aligned to a second sidewall of the gate and (ii) disposed between the gate and the drain contact,
wherein a spacing between the source contact and the first sidewall spacer is less than a spacing between the drain contact and the second sidewall spacer.

20. The transistor structure of claim 1, wherein:
the source contact is in physical contact with a first sidewall spacer; and
the drain contact is not in physical contact with a second sidewall spacer.

* * * * *